(12) United States Patent
Lin et al.

(10) Patent No.: US 9,947,653 B2
(45) Date of Patent: Apr. 17, 2018

(54) HIGH-VOLTAGE SEMICONDUCTOR DEVICES

(71) Applicant: Vanguard International Semiconductor Corporation, Hsinchu (TW)

(72) Inventors: Shin-Cheng Lin, Tainan (TW); Hsiao-Ling Chiang, Hsinchu (TW)

(73) Assignee: VANGAURD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/184,484

(22) Filed: Jun. 16, 2016

(65) Prior Publication Data

US 2017/0365599 A1 Dec. 21, 2017

(51) Int. Cl.
| | |
|---|---|
| *H01L 21/70* | (2006.01) |
| *H01L 27/06* | (2006.01) |
| *H01L 29/06* | (2006.01) |
| *H01L 29/08* | (2006.01) |
| *H01L 49/02* | (2006.01) |
| *H01L 29/40* | (2006.01) |
| *H01L 29/423* | (2006.01) |

(52) U.S. Cl.
CPC ....... *H01L 27/0629* (2013.01); *H01L 28/20* (2013.01); *H01L 29/0653* (2013.01); *H01L 29/0692* (2013.01); *H01L 29/0886* (2013.01); *H01L 29/405* (2013.01); *H01L 29/4238* (2013.01)

(58) Field of Classification Search
USPC .................................................. 257/380, 330
See application file for complete search history.

(56) References Cited

U.S. PATENT DOCUMENTS

| | | | |
|---|---|---|---|
| 5,330,930 A | 7/1994 | Chi | |
| 2008/0042919 A1* | 2/2008 | Arnold | ................. H01L 27/088 343/876 |
| 2013/0200447 A1* | 8/2013 | Yen | ..................... H01L 23/5228 257/296 |
| 2015/0262995 A1* | 9/2015 | Huo | .................... H01L 27/0288 257/360 |

\* cited by examiner

*Primary Examiner* — Timor Karimy
(74) *Attorney, Agent, or Firm* — Birch, Stewart, Kolasch & Birch, LLP

(57) ABSTRACT

A high-voltage semiconductor device includes a MOS device and a resistor device. The MOS device has a source, a drain, a drain insulation region adjacent to the drain, and a gate adjacent to the source. The resistor device is formed on the drain insulation region and is electrically connected to the drain. The resistor device has a plurality of resistor sections connected in series, and each of the plurality of resistor sections has a curved shape.

7 Claims, 4 Drawing Sheets

HIGH-VOLTAGE SEMICONDUCTOR DEVICES

BACKGROUND OF THE INVENTION

Field of the Invention

The present disclosure relates to a semiconductor and more particularly to a high-voltage semiconductor which has resistor sections in a curved shape.

Description of the Related Art

A voltage divider composed of a plurality of resistors is often utilized in an alternating current (AC) or a direct current (DC) semiconductor circuit. Ordinary, the voltage divider is formed by providing a polysilicon resistor of high resistivity on a field oxide (FOX) layer. One drawback of the voltage divider is that high voltage able to be applied to a high-voltage terminal of a polysilicon resistor will be limited by the thickness of the FOX layer. To improve the withstand voltage property, a spiral polysilicon resistor and an ultra-high voltage (UHV) diode connected in parallel may be utilized, where the UHV diode works for bearing the high voltage.

A polysilicon resistor of high resistance and a UHV MOS transistor can be integrated for reducing the area or layout of an integrated circuit. However, as demand for higher current increases, the aforementioned structure becomes inadequate. UHV MOS transistors with increased scale have been proposed for the increasing current, but the enlarged UHV MOS transistors inevitably result in over-increased resistance. Attempting to reduce the resistance will damage the electric field distribution of the UHV MOS transistor below the polysilicon resistor due to limitations of the shape of the UHV MOS transistor, thus resulting in insufficiency of the withstand voltage.

BRIEF SUMMARY OF THE INVENTION

An embodiment of the present disclosure provides a high-voltage semiconductor device, comprising a metal oxide semiconductor (MOS) device and a resistor device. The MOS transistor has a source and a drain, a drain insulation region adjacent to the drain, and a gate adjacent to the source. The resistor device is formed on the drain insulation region and is electrically connected to the drain. The resistor device has a plurality of resistor sections which are connected in series, and each of the resistor sections is curved.

Another embodiment of the present disclosure provides a high-voltage semiconductor device comprises a finger-type drain region, a source region, an insulation region, a gate region and a resistor device. The finger-type drain region has a plurality of drain finger portions. The source region surrounds the finger-type drain region and has a plurality of source pocket portions corresponding to the drain finger portions. The insulation region is formed between the finger-type drain region and the source region, and is located adjacent to the finger type drain region. The gate region is formed between the insulation region and the source region. The resistor device is formed on the insulation region and is electrically connected to one of the drain finger portions of the finger-type drain region. The resistor device has a plurality of resistor sections which are connected in series, and each of the resistor sections is curved. Each of the resistor sections is in the shape of a moon, arc or "C".

A detailed description is given in the following embodiments with reference to the accompanying drawings.

BRIEF DESCRIPTION OF THE DRAWINGS

The present disclosure is can be fully understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE INVENTION

Figure 1:
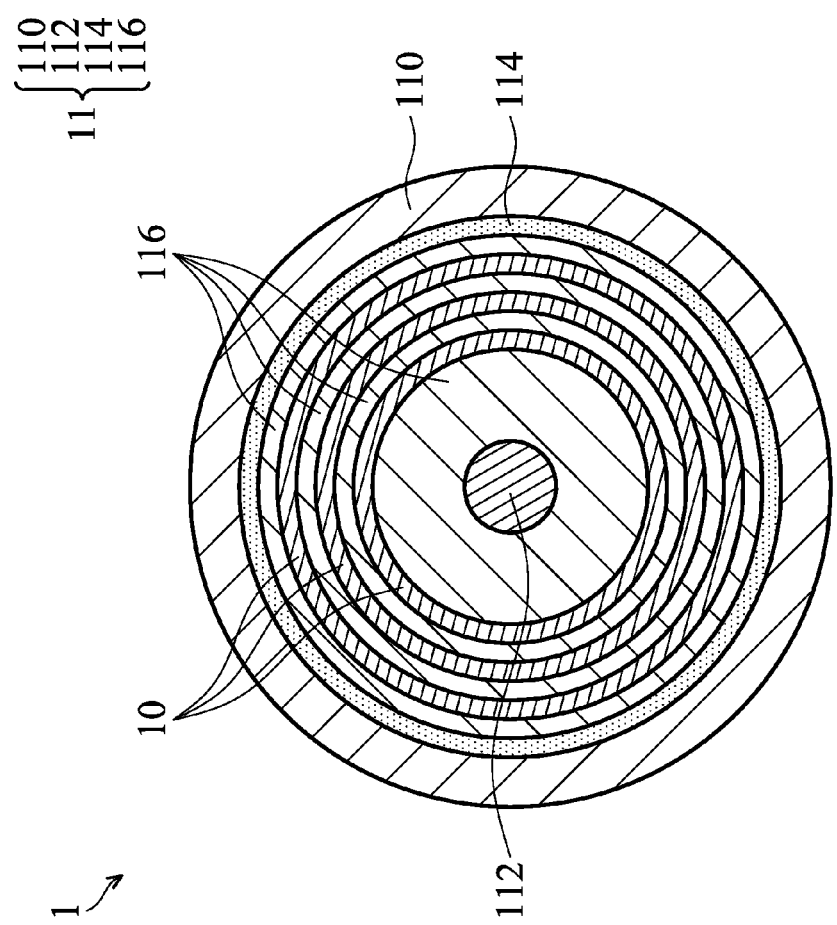
FIG. 1 shows a top view of a high-voltage semiconductor device, wherein the shape of the high-voltage semiconductor device is a circle.

The following disclosure provides embodiments or examples, for implementing different features of the subject matter provided. Specific examples of components and arrangements are described below to simplify the present disclosure. These are, of course, merely examples and are not intended to limit. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath", "below", "lower", "above", "upper" and the like, may be used herein to describe relationship between one element or feature to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, it shows a top view (layout) of a high-voltage semiconductor device. The high-voltage semiconductor device 1 includes a circular MOS device 11 and a resistor device 10. The circular MOS device 11 includes a heavily n$^+$-doped source 110, a heavily n$^+$-doped drain 112, a drain insulation region 116, and a gate 114. The drain insulation region 116 surrounds the heavily n$^+$-doped drain 112. The gate 114 surrounds the drain insulation region 116. The resistor device 10 is formed on the drain insulation region 116, and electrically connected to the heavily n$^+$-doped drain 112. In FIG. 1, the connection of the resistor device 10 and the heavily n$^+$-doped drain 112 is not shown for brevity. In addition, the drain insulation region 116 may be a field oxide (FOX) layer region, wherein the FOX layer region may be formed by silicon dioxide.

With the increase in demand for higher currents, the structure of the circular MOS device 11 and the resistor device 10 which are connected in parallel may provide an inadequate withstand voltage. At this time, a MOS device having a running track structure and a polysilicon resistor having high resistance connected in parallel are proposed.

Figure 2:
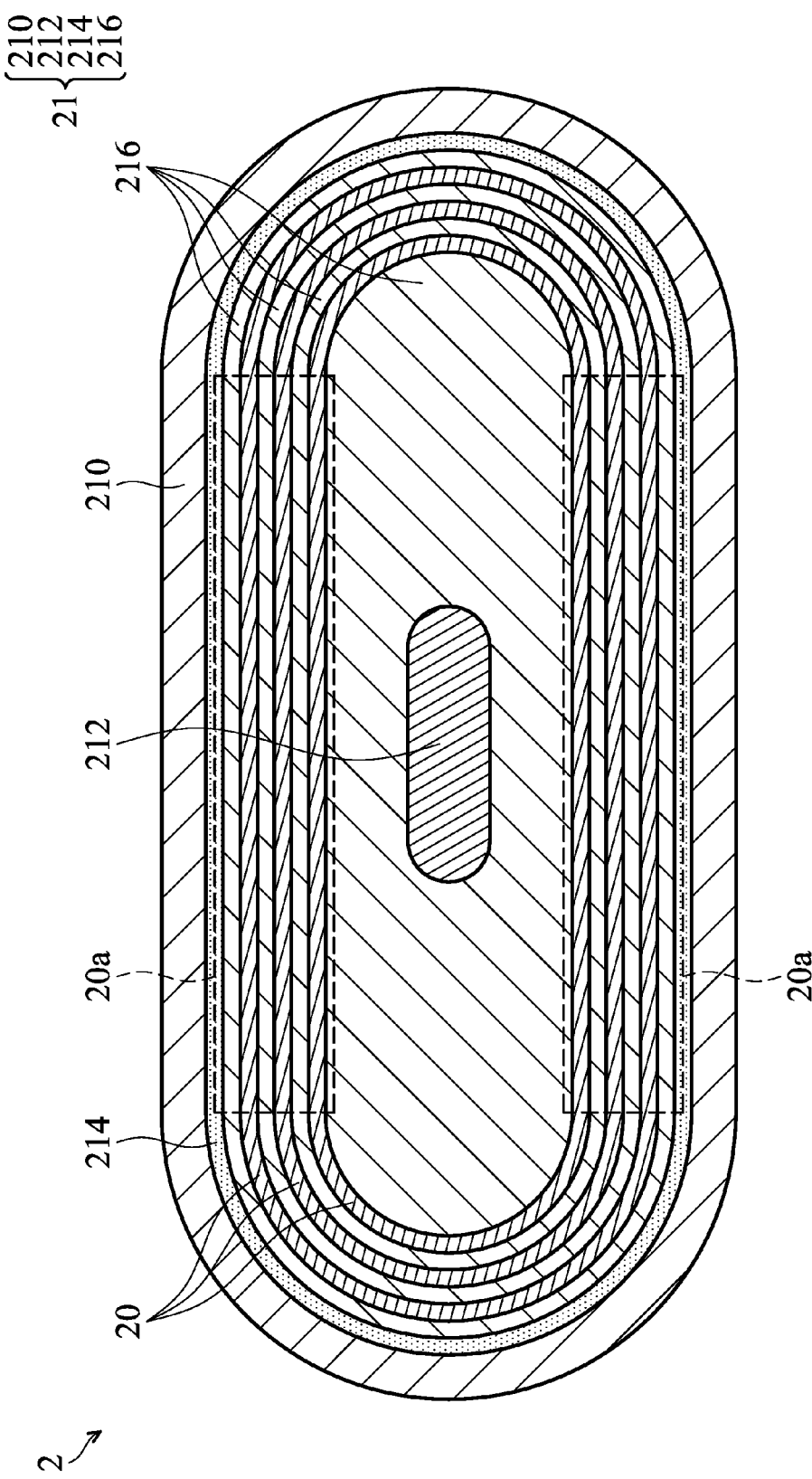
FIG. 2 shows a top view of a high-voltage semiconductor device with a MOS device having a running track structure.

Referring to FIG. 2, which shows a top view (layout diagram) of a high-voltage semiconductor device, the high-voltage semiconductor device 2 includes a MOS device 21 with a running track structure and a resistor device 20. The MOS device 21 includes a heavily $n^+$-doped source 210, a heavily $n^+$-doped drain 212, a drain insulation region 216, and a gate 214. The drain insulation region 216 surrounds the heavily $n^+$-doped drain 212. The gate 214 surrounds the drain insulation region 216. The resistor device 20 is formed on the drain insulation region 216, and electrically connected to the heavily $n^+$-doped drain 212. In FIG. 2, the connection of the resistor device 20 and the heavily $n^+$-doped drain 212 is not shown for brevity. In addition, the drain insulation region 216 may be a field oxide (FOX) layer region, wherein the FOX layer region may be formed by silicon dioxide.

In FIG. 2, the resistor device 20 is formed on the drain insulation region 216 of the MOS device 21. The resistor device 20 is entirely formed by polysilicon resistors of high resistance. As the length of the running track of the MOS device 21 becomes longer, the resistance of the resistor device 20 becomes too large. If the polysilicon resistors of the resistor device 20 are provided with a larger space between any two adjacent polysilicon resistors to reduce the resistance, the electric field distribution of the MOS device 21 will be damaged, resulting in degradation of the withstand voltage.

The straight portions 20a (as shown in FIG. 2a) of the resistor device 20 can be replaced by metal to reduce the resistance of the resistor device 20.

However, the above solution cannot be applied to a finger-type UHV MOS transistor. Voltages drops are generated due to the lengths of the metal segments becoming too long, and the metal segments with different voltage drops which are observed from the same power line will affect the breakdown voltage characteristics. In addition, the complexity and cost of fabricating the UHV MOS transistor are increased. Accordingly, the present disclosure further provides a high-voltage semiconductor device to reduce the demand area (layout), the resistance, and to avoid affecting the characteristics of the breakdown voltage.

Figure 3:
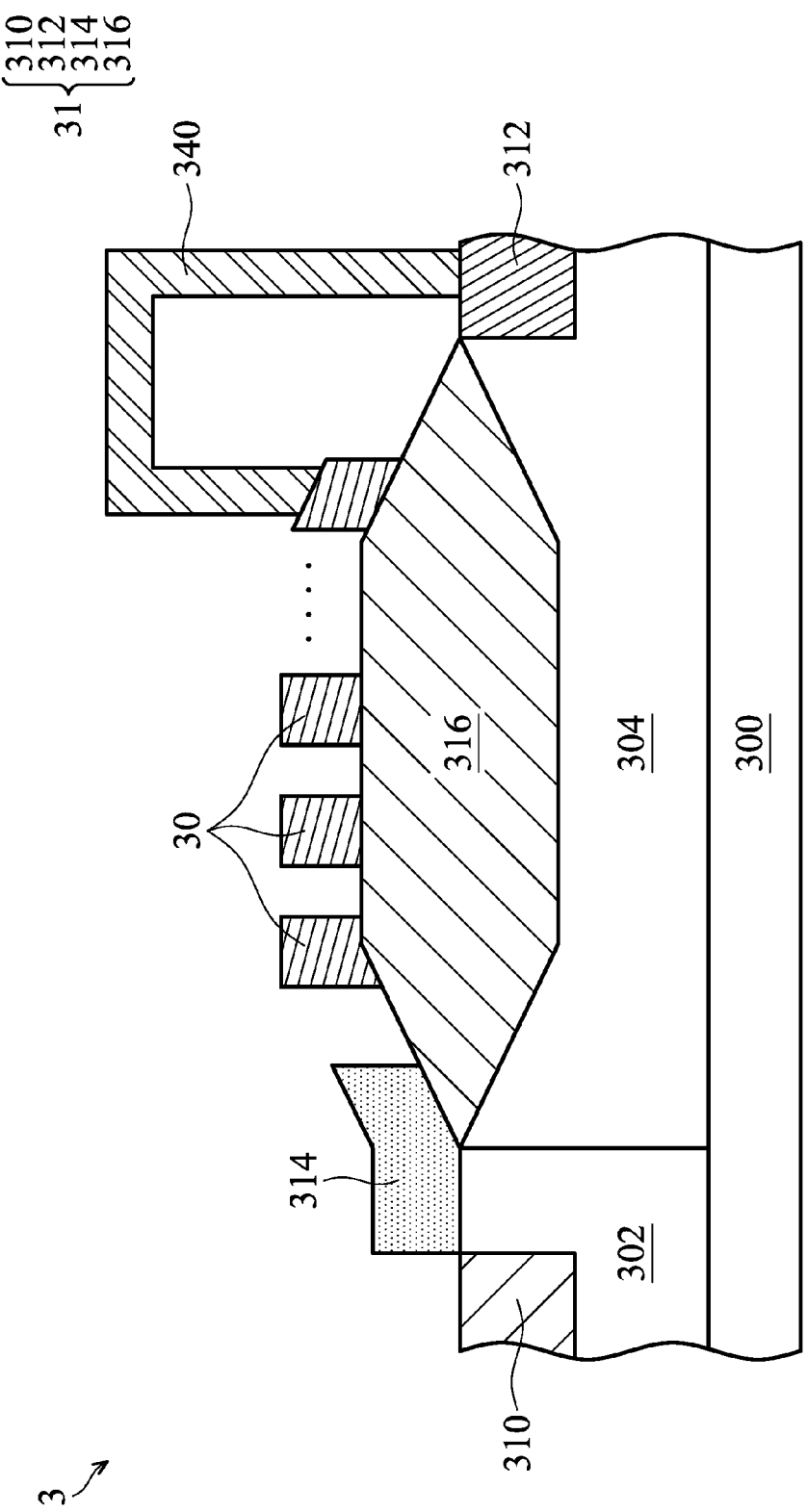
FIG. 3 shows a cross section view of a high-voltage semiconductor device according to one embodiment of the present disclosure.

FIG. 3 shows a cross-sectional view of a high-voltage semiconductor device according to an embodiment of the present disclosure. Referring to FIG. 3, the high-voltage semiconductor device 3 includes a MOS device 31 and a resistor device 30. The MOS device 31 includes a source 310, a drain 312, a drain insulation region 316 and a gate 314. The drain insulation region 316 is disposed between the drain insulation region 316 and the source 310, and is adjacent to the drain 312. The gate 314 is disposed between the drain insulation region 316 and the source 310. The resistor device 30 is formed on the drain insulation region 316, and is electrically connected to the drain 112. The resistor device 30 has a plurality of resistor sections connected in series, and each of the plurality of resistor sections has a curved shape.

In the embodiment, the MOS device 31 is formed on a p-type substrate 300. In the p-type substrate 300, a p-type well region 302 and an n-type region 304 are formed. On the p-type well region 302, the source 310 and the gate 314 are formed. On the n-type well region 304, the drain insulation region 316 and the drain 312 are formed. A p-n junction is formed between the p-type well region 302 and the n-type well region 304. The drain insulation region 316, for example, is a FOX layer.

In the embodiment, the resistor device 30 is formed by using polysilicon resistors or metal.

In the embodiment, each of the plurality of resistor sections of the resistor device 30 is a resistor segment of curved shape. And the curved shape may be a moon shape, an arc shape or a "C" shape.

Figure 4:
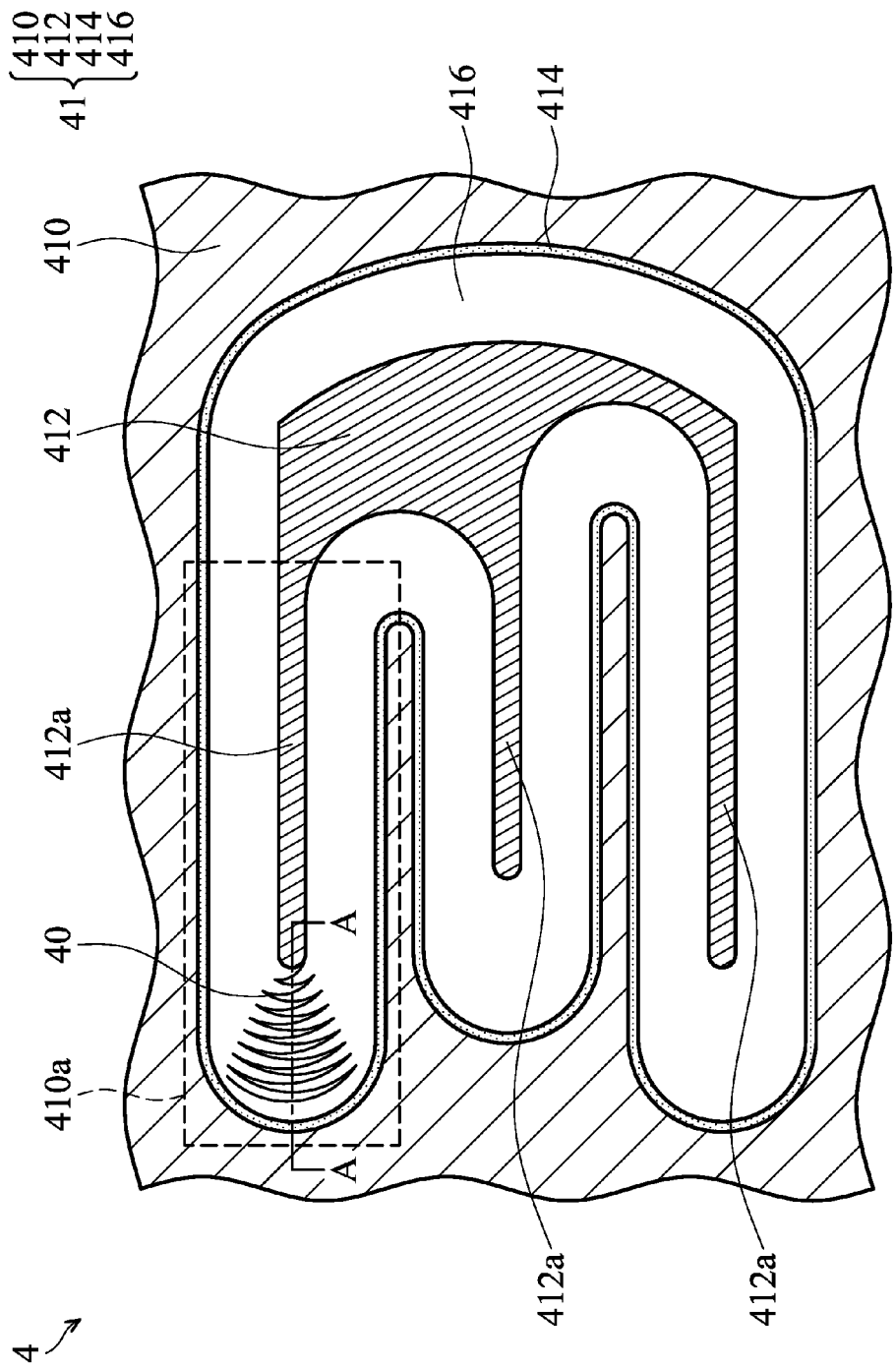
FIG. 4 shows a top view of a high-voltage semiconductor device according to another embodiment of the present disclosure.

FIG. 4 shows a high-voltage semiconductor device according to another embodiment of the present disclosure.

FIG. 4 shows a top view of a high-voltage semiconductor device 4. The high-voltage semiconductor device 4 mainly comprises a finger-type MOS device 41 and a resistor device 40. The finger-type MOS 41 includes a finger-type drain region 412, a source region 410, a drain insulation region 416, and a gate region 414. The finger-type drain region 412 has a plurality of drain finger portions 412a. The source region 410 surrounding the finger-type drain region 412 has a plurality of source pocket portions 410a that respectively correspond to the plurality of drain finger portions 412a. In the embodiment, the finger-type MOS 41 has three drain finger portions 412a and three source pocket portions 410a, but it is not limited thereto. The drain insulation region 416 is formed between the finger-type drain region 412 and the source region 410, and is located adjacent to the finger type drain region 412. The gate region 414 surrounds the drain insulation region 416, and is formed between the drain insulation region 416 and the source region 410.

The resistor device 40 is formed on the drain insulation region 416 and electrically connected to one of the drain finger portions 412a of the finger-type drain region 412. Moreover, the drain insulation region 416 may be a field oxide (FOX) layer region, wherein the FOX layer region is formed by silicon dioxide.

In the embodiment, the resistor device 40 is formed by polysilicon or metal. The resistor device 40 has a plurality of resistor sections connected in series (one-by-one), and each of the plurality of resistor sections is curved. Each of the resistor sections can be a curved segment having a specific width. Moreover, each of the resistor sections is in the shape of a moon (such as crescent moon), arc or "C".

In the embodiment, the resistor sections of the resistor device 40 are connected in zigzag and extend from one of the drain finger portions, which is electrically connected to the resistor device 40, toward the bottom of a source pocket portion 410a corresponding to the drain finger portion 412a, as shown in FIG. 4. Moreover, the closer the resister section is to the bottom of the source pocket, the longer its length is.

In the embodiment described in FIG. 4, only one resistor device 40 is electrically connected to the drain finger portion 412a, but the present disclosure is not limited thereto. A plurality of resistor devices 40 (e.g., two or three resistor devices in the embodiment) can be electrically connected to their corresponding drain finger portions 412a.

Moreover, the cross section view along line A-A depicted in FIG. 4 is the same as that is shown in FIG. 3. Furthermore, the connecting portions between any two of the plurality of resistor sections are located on both sides of line A-A alternately. In other words, the resistor sections of the resistor device 40 are connected in a zigzag form.

Take the high-voltage semiconductor as shown in FIG. 4 as an example; it doesn't need the MOS device with a running track structure as shown in FIG. 2, therefore reducing the required area or layout. Furthermore, using a resistor device which has curved resistor sections in the shape of a moon, arc or "C" can obtain the effects of resistance continuity and resistance reduction. And the extension way (arrangement) of the plurality of the curved resistor sections can form a field plate effect, thereby elevating breakdown voltage of the high-voltage semiconductor device.

The foregoing outlines features of several embodiments so that those with ordinary skill in the art may better understand the aspects of the present disclosure. Those with ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage semiconductor device, comprising:
   a metal oxide semiconductor (MOS) device, comprising:
      a source and a drain;
      a drain insulation region adjacent to the drain;
      a gate adjacent to the source; and
   a resistor device, formed on the drain insulation region and electrically connected to the drain;
   wherein the resistor device has a plurality of resistor sections which are connected in series, and each of the resistor sections is curved;
   wherein the resistor sections are connected in a zigzag form and extend from the drain toward the source, and the closer the resister section is to the source, the longer its length is.

2. The high-voltage semiconductor device as claimed in claim 1, wherein the resistor device is made of polysilicon or metal.

3. The high-voltage semiconductor device as claimed in claim 1, wherein each of the resistor sections is in a shape of a moon, arc or "C".

4. A high-voltage semiconductor device, comprising:
   a finger-type drain region having a plurality of drain finger portions;
   a source region surrounding the finger-type drain region, the source region having a plurality of source pocket portions corresponding to the drain finger portions;
   an insulation region formed between the finger-type drain region and the source region, and adjacent to the finger type drain region;
   a gate region formed between the insulation region and the source region; and
   a resistor device formed on the insulation region and electrically connected to one of the drain finger portions of the finger-type drain region;
   wherein the resistor device has a plurality of resistor sections which are connected in series, and each of the resistor sections is curved.

5. The high-voltage semiconductor device as claimed in claim 4, wherein the resistor device is made of polysilicon or metal.

6. The high-voltage semiconductor device as claimed in claim 4, wherein the resistor sections of the resistor device are connected in a zigzag form and extend from the one of the drain finger portions, which is connected to the resistor device, toward a bottom of a source pocket portion corresponding to the one of the drain finger portions, and the closer the resister section is to the bottom of the source pocket, the longer its length is.

7. The high-voltage semiconductor device as claimed in claim 4, wherein each of the resistor sections is in a shape of a moon, arc or "C".

* * * * *